(12) United States Patent
Gerbi et al.

(10) Patent No.: US 9,911,887 B2
(45) Date of Patent: *Mar. 6, 2018

(54) CHALCOGENIDE-BASED MATERIALS AND IMPROVED METHODS OF MAKING SUCH MATERIALS

(71) Applicant: DOW GLOBAL TECHNOLOGIES LLC, Midland, MI (US)

(72) Inventors: Jennifer E. Gerbi, Midland, MI (US); Marc G. Langlois, Ann Arbor, MI (US); Robert T. Nilsson, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/599,949

(22) Filed: May 19, 2017

(65) Prior Publication Data

US 2017/0263797 A1 Sep. 14, 2017

Related U.S. Application Data

(60) Continuation of application No. 14/641,796, filed on Mar. 9, 2015, which is a division of application No.
(Continued)

(51) Int. Cl.
*H01L 31/0749* (2012.01)
*C23C 14/06* (2006.01)
(Continued)

(52) U.S. Cl.
CPC ...... *H01L 31/0749* (2013.01); *C23C 14/0623* (2013.01); *C23C 14/3464* (2013.01);
(Continued)

(58) Field of Classification Search
CPC ........... H01L 31/0749; H01L 21/02568; H01L 21/02614; H01L 21/02631; C23C 14/0623; C23C 14/3464; C23C 14/5866
See application file for complete search history.

(56) References Cited

U.S. PATENT DOCUMENTS

| | | |
|---|---|---|
| 4,915,745 A | 4/1990 | Pollock et al. |
| 5,439,575 A | 8/1995 | Thornton |

(Continued)

FOREIGN PATENT DOCUMENTS

| | | |
|---|---|---|
| EP | 0318315 | 11/1988 |
| JP | 2005-23494 | 9/2005 |

(Continued)

OTHER PUBLICATIONS

Nakada et al., "Improved Cu(In,Ga)(S,Se)$_2$ thin film solar cells by surface sulfurization," Solar Energy Materials and Solar Cells, 49, pp. 285-290, 1997.

(Continued)

*Primary Examiner* — Golam Mowla
(74) *Attorney, Agent, or Firm* — Kagan Binder, PLLC

(57) ABSTRACT

The present invention provides strategies for making high quality CIGS photoabsorbing materials from precursor films that incorporate a sub-stoichiometric amount of chalcogen(s). Chalcogen(s) are incorporated into the CIGS precursor film via co-sputtering with one or more other constituents of the precursor. Optional annealing also may be practiced to convert precursor into more desirable chalcopyrite crystalline form in event all or a portion of the precursor has another constitution. The resultant precursors generally are sub-stoichiometric with respect to chalcogen and have very poor electronic characteristics. The conversion of these precursors into CIGS photoabsorbing material via chalcogenizing treatment occurs with dramatically reduced interfacial void content. The resultant CIGS material displays (Continued)

excellent adhesion to other layers in the resultant photovoltaic devices. Ga migration also is dramatically reduced, and the resultant films have optimized Ga profiles in the top or bottom portion of the film that improve the quality of photovoltaic devices made using the films.

6 Claims, 3 Drawing Sheets

Related U.S. Application Data

13/047,190, filed on Mar. 14, 2011, now Pat. No. 8,993,882.

(60) Provisional application No. 61/314,840, filed on Mar. 17, 2010.

(51) Int. Cl.
    *C23C 14/34*     (2006.01)
    *C23C 14/58*     (2006.01)
    *H01L 21/02*     (2006.01)

(52) U.S. Cl.
    CPC .... *C23C 14/5866* (2013.01); *H01L 21/02568* (2013.01); *H01L 21/02614* (2013.01); *H01L 21/02631* (2013.01)

(56) References Cited

U.S. PATENT DOCUMENTS

| | | | |
|---|---|---|---|
| 5,674,555 | A | 10/1997 | Birkmire |
| 6,323,417 | B1 | 11/2001 | Gillespie |
| 6,518,086 | B2 | 2/2003 | Beck |
| 6,974,976 | B2 | 12/2005 | Hollars |
| 7,867,551 | B2 | 1/2011 | Basol |
| 2002/0106873 | A1 | 8/2002 | Beck |
| 2005/0006221 | A1 | 1/2005 | Takeuchi et al. |
| 2005/0183768 | A1 | 8/2005 | Sager |
| 2006/0121701 | A1 | 6/2006 | Basol |
| 2006/0207644 | A1 | 9/2006 | Robinson |
| 2006/0222558 | A1 | 10/2006 | Alberts |
| 2007/0004078 | A1 | 1/2007 | Alberts |
| 2007/0093059 | A1 | 4/2007 | Basol |
| 2007/0257255 | A1 | 11/2007 | Dhere et al. |
| 2008/0105542 | A1 | 5/2008 | Purdy |
| 2008/0121137 | A1 | 5/2008 | Van Osten et al. |
| 2008/0289953 | A1 | 11/2008 | Hollars |
| 2009/0035882 | A1 | 2/2009 | Basal |
| 2009/0050208 | A1 | 2/2009 | Basol |
| 2009/0117684 | A1 | 5/2009 | Basol |
| 2009/0139573 | A1 | 6/2009 | Ramasesha |
| 2009/0145746 | A1 | 6/2009 | Hollars |
| 2010/0065418 | A1 | 3/2010 | Ellmer et al. |

FOREIGN PATENT DOCUMENTS

| | | |
|---|---|---|
| WO | WO 90/15445 | 6/1990 |
| WO | 98/48079 | 10/1998 |
| WO | WO 2004/032189 | 9/2003 |
| WO | WO 2005/017978 | 8/2004 |
| WO | WO 2008064632 | 6/2008 |
| WO | 2009/051862 | 4/2009 |
| WO | 2011/090728 | 7/2011 |
| WO | WO 2011/107035 | 9/2011 |

OTHER PUBLICATIONS

Nagoya et al., "Role of incorporated sulfur into the surface of Cu(InGa)Se$_2$ thin-film absorber," Solar Energy Materials & Solar Cells, 67, pp. 247-253, 2001.

Chen et al, "Another Route to fabricate single-phase chalcogenides by post-selenization of Cu—In—Ga precursors sputter deposited from a single ternary target," Solar Energy Materials & Solar Cells, 93, pp. 1351-1355, 2009.

U.S. Appl. No. 60/290,490, filed Dec. 28, 2010, Jackrel et al.

R. Friedfeld et al., "Electrodeposition of CuIn$_x$Ga$_{1-x}$Se$_2$ thin films" Solar Energy Materials & Solar Cells 58 (1999) pp. 375-385.

T. Dullweber et al., "Study of the effect of gallium grading in Cu(In,Ga)Se$_2$" Thin Solid Films, 361-362 (2000), pp. 478-481.

T. Dullweber et al., "Back surface band gap in gradings in Cu(In,Ga)Se$_2$ solar cells" Thin Solid Films 387 (2001), pp. 11-13.

G. Voorwinden et al., "In-line Cu(In,Ga)Se$_2$ co-evaporation process with graded band gaps on large substrates" Thin Solid Films 431-432 (2003), pp. 538-542.

C. Lei et al., "Void formation and surface energies in Cu(InGa)Se$_2$" Journal of Applied Physics 100, 073518 (2006), pp. 073518-1-073518-5.

Ingrid Repins et al., 19.9%-efficient ZnO/CdS/CuInGaSe$^2$ Solar Cell with 81.2% Fill Factor Prog. Photovolt: Res. Appl. (2008)16: pp. 235-239.

G. Ostberg et al., "Interfaces in Cu(In,Ga)Se$_2$ thin solar cells" EMC (2008), vol. 2: Materials Science, pp. 661-662.

A. Drici et al., "Cu(In$_1$-Ga$_x$)Se$_2$ co-evaporated thin films from simple tungsten baskets-Influence of the gallium source" Materials Chemistry and Physics 110 (2008), pp. 76-82.

M. Powalla et al., "Highly efficient CIS solar cells and modules made by the co-evaporation process" Thin Solid Films 517 (2009), pp. 2111-2114.

Nakada et al., "CuInSerbased solar cells by Se-vapor selenizaiton from Se-containing precursors" Solar Ener!N Materials and Solar Cells, 35, pp. 209-214, 1994.

Beck et al., "CuIn(Ga)Se$_2$-based devices via a novel absorber formation process" Solar Energy Materials and Solar Cells, 64, pp. 135-165, 2000.

R. Friedfeld et al., "Fabrication of Cu(In,Ga)Se$_2$ thin film solar cell absorbers" Current Applied Physics 10 (2010) pp. S146-S149.

English Translation of Notice of Preliminary Rejection issued by Korean Intellectual Property Office, Oct. 20, 2016, pp. 1-7.

Min-Sik-Kim, "Growth of Large-Grained Cu(In,Ga)Se2 Thin Film Using Cu2Se Layer on Cu—In—Ga Precursor and Its Application to Photovoltaic Device" Doctoral Thesis KAIST, Department of Material Science and Engineering, 2009, Abstract, pp. i-iii.

Min-Sik-Kim, "Growth of Large-Grained Cu(In,Ga)Se2 Thin Film Using Cu2Se Layer on Cu—In—Ga Precursor and Its Application to Photovoltaic Device" Doctoral Thesis KAIST, 2009, front matter and pp. 1-155.

Response dated Dec. 16, 2016 to Korean Patent Application No. 10-2012-7026910 Notice of Preliminary Rejection issued by Korean Intellectual Property Office dated Oct. 20, 2016, pp. 1-8.

CHALCOGENIDE-BASED MATERIALS AND IMPROVED METHODS OF MAKING SUCH MATERIALS

PRIORITY

The present nonprovisional patent application is a continuing application of U.S. Ser. No. 14/641,796, filed Mar. 9, 2015, which is a divisional application of U.S. Ser. No. 13/047,190, filed Mar. 14, 2011 (issued as U.S. Pat. No. 8,993,882), which claims priority under 35 U.S.C. § 119(e) from U.S. Provisional patent application having Ser. No. 61/314,840, filed on Mar. 17, 2010, by Gerbi et al. and titled CHALCOGENIDE-BASED MATERIALS AND IMPROVED METHODS OF MAKING SUCH MATERIALS, wherein the entirety of each of said patent applications and said patent is incorporated herein by reference for all purposes.

FIELD OF THE INVENTION

The present invention relates to methods for making chalcogenide-based photoabsorbing materials as well as to photovoltaic devices that incorporate these materials. More specifically, the present invention relates to methods for making chalcogenide-based photoabsorbing materials, desirably in the form of thin films as well as to photovoltaic devices that incorporate these materials, in which a precursor film incorporating a sub-stoichiometric amount of chalcogen is prepared and then converted to the desired photoabsorbing composition via a chalcogenization treatment.

BACKGROUND OF THE INVENTION

Both n-type chalcogenide materials and/or p-type chalcogenide materials have photovoltaic functionality (also referred to herein photoabsorbing functionality). These materials absorb incident light and generate an electric output when incorporated into a photovoltaic device. Consequently, these chalcogenide-based photoabsorbing materials have been used as the photovoltaic absorber region in functioning photovoltaic devices.

Illustrative p-type chalcogenide materials often include sulfides, selenides, and/or tellurides of at least one or more of copper (Cu), indium (In), gallium (Ga), and/or aluminum (Al). Selenides and sulfides are more common than tellurides. Although specific chalcogenide compositions may be referred to by acronyms such as CIS, CISS, CIGS, CIGST, CIGSAT, and/or CIGSS compositions, or the like, the term "CIGS" shall hereinafter refer to all chalcogenide compositions and/or all precursors thereof unless otherwise expressly noted.

Photoabsorbers based upon CIGS compositions offer several advantages. As one advantage, these compositions have a very high cross-section for absorbing incident light. This means that CIGS-based absorber layers that are very thin can capture a very high percentage of incident light. For example, in many devices, CIGS-based absorber layers have a thickness in the range of from about 1 µm to about 2 µm. These thin layers allow devices incorporating these layers to be flexible. Thin layers use less material reducing the cost of the photovoltaic devices. This is in contrast to crystalline silicon-based absorbers. Crystalline silicon-based absorbers have a lower cross-section for light capture and generally must be much thicker to capture the same amount of incident light. Crystalline silicon-based absorbers tend to be rigid, not flexible.

Industry has invested and continues to invest considerable resources in developing this technology. Making stoichiometric, photoabsorbing compositions with industrially scalable processes, however, continues to be quite challenging. According to one proposed manufacturing technique, deposition methods are used in an initial stage to deposit and/or co-deposit element(s) in one or more layers to form precursor film(s). Chalcogen(s) conventionally are incorporated via chalcogenization into the precursor at a later processing stage. Chalcogenization often involves a thermal treatment in order to both incorporate chalcogen into the precursor and to crystallize the film to convert the film to the desired photoabsorbing layer. Because chalcogenization occurs after the precursors are at least partially formed, these processes can be referred to as "post-chalcogenization" processes.

There are many serious challenges to overcome with this approach. As one challenge, chalcogenizing a precursor tends to induce significant volume expansion of the film. This expansion can cause mechanical stresses that reduce adhesion, induce stresses, and/or other problems. It would be highly desirable to be able to reduce volume expansion when chalcogenizing precursor films.

Additionally, very large voids tend to form in large part at the bottom of the film adjacent the backside contact (e.g., a Mo layer in many instances) as a consequence of chalcogenizing the precursor. These large voids tend to cause adhesion problems between the CIGS layer and the backside contact layer. Electronic performance and service life also can be seriously compromised. These large voids also can induce mechanical stresses that lead to delamination, fractures, and the like. It remains very desirable to find a way to reduce or even eliminate total number, size, and even location of these voids in the finished CIGS film.

As another drawback, post-selenization processes tend to induce significant gallium migration in the film. Generally, substantial portions, and even substantially all, of the gallium in upper film regions tend to migrate to the bottom of the film. The top of the film may become completely Ga depleted. In the worst case, full Ga segregation can result such that the bottom of the film incorporates Cu, Ga, and Se, while the top of the film includes only Cu, In, and Se. This may have negative repercussions for film adhesion. Even more importantly, if some Ga is not located within the region of the CIGS film where much of the incident light is absorbed (e.g., in at least approximately the top 300 nm), the bandgap increase due to Ga is essentially lost. Such Ga depletion clearly compromises the electronic performance of the photovoltaic device. It remains very desirable to find a way to reduce and even eliminate gallium migration, or to incorporate Ga only into the areas of the film that yield a benefit (e.g., within the top approximately 300 nm of CIGS film for bandgap enhancement, and within the back region of film for adhesion related void modification and/or minority carrier mirror benefits.)

Some attempts have been made to prepare precursor films that incorporate stoichiometric amounts of chalcogen. For example, the literature describes attempts to form CIGS films using compound targets of copper selenides and/or indium gallium selenides. These efforts have not been clearly demonstrated to be brought to practice for an industrial process due to the difficulty in fabricating such sputtering targets (especially for the indium selenide based materials) and the difficulty in obtaining good process control from such targets due to low sputter rates and target degradation.

As another alternative, high-quality CIGS material has been formed by thermal evaporation of all desired elements, including metals, chalcogen(s), and optionally other(s) onto a substrate at a high substrate temperature such that the film reacts and crystallizes fully during growth. Unfortunately, this evaporation approach is not truly scalable with regard to industrial applications, particularly in roll-to-roll processes.

In contrast to thermal evaporation techniques, sputtering techniques offer the potential to be a more scalable method better suited for industrial application of CIGS materials. However, it is very challenging to supply the needed amount of chalcogen during the sputtering of Cu, In, Ga, and/or Al to form high quality CIGS in one step. As a consequence, CIGS films have been sputtered from one or more metal targets in the presence of selenium and/or sulfur containing gas or vapor from an evaporated source. Using only a gas or vapor as a chalcogen source during sputtering of other components typically requires that enough gas be used to at least supply the desired chalcogen content in the precursor film, often with an additional overpressure of chalcogen. Using so much chalcogen-containing gas or vapor tends to cause equipment degradation and Se buildup, target poisoning, instabilities in process control (resulting in composition and rate hysteresis), the loss of In from the deposited film due to volatile $In_xSe_y$ compounds, lowered overall deposition rates, and the damage of targets due to electrical arcing.

SUMMARY OF THE INVENTION

The present invention provides strategies for making high quality CIGS photoabsorbing compositions from sputtered precursor film(s) that incorporate chalcogen(s) with a sub-stoichiometric concentration, with the option of localizing a sub-layer of this chalcogen-containing layer at a specific location within the precursor film(s). The conversion of these precursors into CIGS photoabsorbing material via a following chalcogenizing treatment (also referred to as "post-chalcogenization," including, e.g., "post-selenization" when Se is used) provides one or more or all of the following benefits: clearly reduced overall void area and size; altered void location within the film such that a majority of voids are not located at the CIGS-back contact interface; improved adhesion; reduced Ga migration upon chalcogenization; improved Ga concentrations in the top region of the post-selenized CIGS film relative to a purely metal precursor film that is post selenized; improved Ga concentrations in the bottom boundary region; and improved film smoothness resulting in fewer device defects via the improvement in conformality of overlying photovoltaic device layers.

In one aspect, the present invention relates to a method of making a chalcogen-containing photoabsorbing composition. A precursor of the chalcogen-containing photoabsorber is formed wherein the precursor includes a sub-stoichiometric amount of at least one chalcogen. The precursor is subjected to a chalcogenization treatment. The present invention also encompasses photovoltaic devices made by this method.

In another aspect, the present invention relates to a photovoltaic device that comprises a chalcogen-containing photoabsorbing film having a top surface and a bottom surface. The photoabsorbing film comprises a void content of 0.5 to 50%. The film also includes from about 0.1 to about 60 atomic percent Ga at least in a first boundary region proximal to the bottom surface of the photoabsorbing film and/or a second boundary region proximal to the top surface of the photoabsorbing film, wherein the atomic percent Ga is based on the total composition of the corresponding boundary region.

In another aspect the present invention relates to a precursor film of a chalcogen-containing photoabsorbing material. The precursor comprises from about 0.1 to about 60 atomic percent Ga selectively co-incorporated into one or more portions of the precursor with at least one chalcogen based upon the total composition of said portion; and wherein the precursor includes a sub-stoichiometric amount of a chalcogen based upon the overall composition of the precursor film.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

Figure 1:
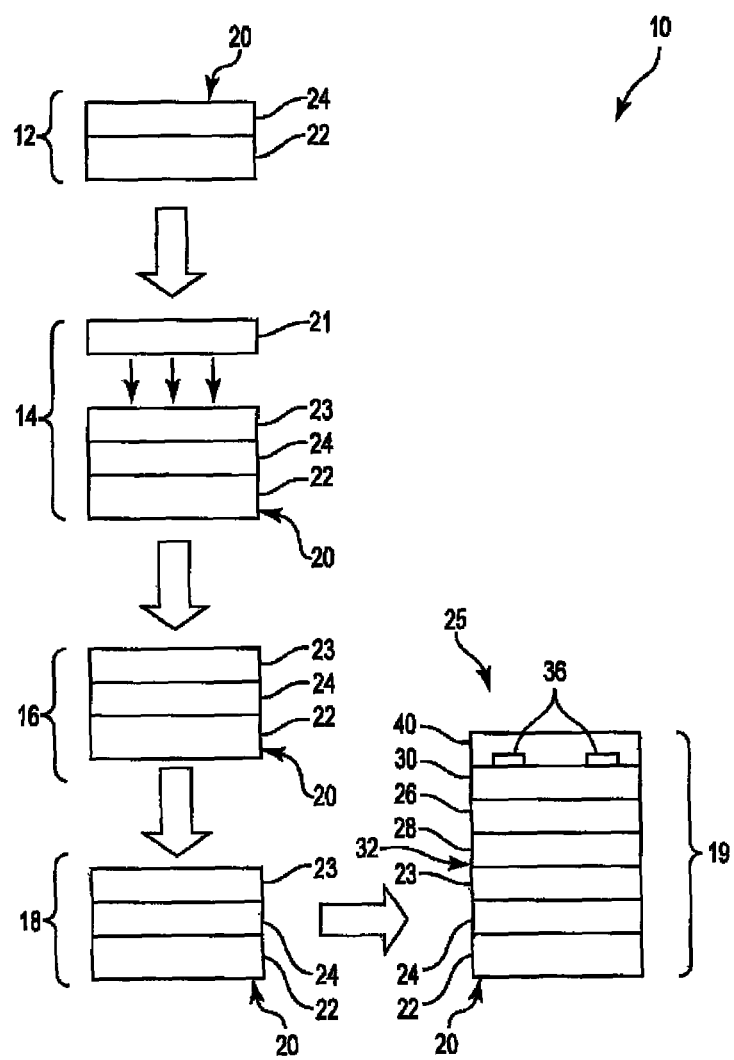
FIG. 1 is a schematic diagram showing how to make a photovoltaic device according to a representative embodiment of the present invention in which a single layer CIGS precursor film is prepared via sputtering from a single target.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

The principles of the present invention are used to form high quality, chalcogenide-based photovoltaic materials for use in photovoltaic devices. As an overview, the methodology of the invention includes at least two main stages. In an initial reaction stage, a precursor of the chalcogen-containing photoabsorber is formed wherein the precursor overall includes a sub-stoichiometric amount of at least one chalcogen, although particular portions of the film might include a stoichiometric amount of chalcogen or even an excess. In a further stage, the precursor film is subjected to a chalcogenization treatment to incorporate additional chalcogen into the film and thereby provide the composition with the final chalcogen content. If needed, the film optionally also can be subjected to a crystallization treatment such as by annealing or the like to convert the precursor to a more desirable tetragonal chalcopyrite crystalline form, to increase grain size, and/or the like. Crystallization (e.g., annealing) and chalcogenization can occur separately, in overlapping fashion, and/or simultaneously. Conveniently, the precursor film can be subjected to a thermal treatment in the presence of one or more chalcogens that accomplishes both chalcogenization and crystallization.

The present invention is versatile and can be used in a wide variety of processes. For instance, the present invention can be practiced in batch or continuous processes. The present invention can be practiced at an industrial scale. These principles allow these materials to be formed in a manner that is compatible with continuous, roll-to-roll manufacturing strategies.

Using a chalcogen-deficient precursor as an intermediate to make photoelectronically active chalcogen-containing materials provides many advantages. Quite significantly, this approach dramatically reduces the degree of Ga migration upon post-chalcogenization in those precursor embodiments that incorporate Ga. Surprisingly, when a precursor film is prepared by co-depositing ingredients including Ga and a chalcogen either throughout the film or within a particular portion of the film, the present invention dramatically reduces Ga migration from such regions. In one embodiment in which Ga and sub-stoichiometric Se were co-deposited throughout a precursor film also including Cu and In, Ga, migration was observed to be negligible. The final photoelectronically active CIGS material had a constant Ga profile throughout the film, as measured by scanning XTEM with EDS (energy dispersive X-ray during cross-sectional scanning transmission electronic microscopy) measurements of the film. Samples for measurements of Ga profiles are prepared using a standard cross-sectional technique suitable to render the film electron transparent so that TEM can be performed, such as focused ion beam (FIB) cross-sectioning.

The Ga retention in the near-surface of the film can also be verified by quantum efficiency measurements of the finished cell that yield the bandgap of the absorptive part of the CIGS film. Without wishing to be bound, a theory to explain this advantage can be suggested. It is believed that the highly reactive, sputtered chalcogen species bonds with, and/or helps other film ingredients bond with, the Ga to form Ga-containing species that are relatively immobile and much less prone to migration during chalcogenization.

Consequently, the Ga distribution of the photoelectronically active CIGS film tends to very closely match the Se and Ga distribution of the precursor. If Se is deposited with a particular distribution or selective placement through the depth of the precursor, and the precursor contains either Ga throughout the film, or selective Ga where the Se is deposited, generally a substantially similar Ga distribution or placement similar to the precursor Se placement will be maintained in the final film. The ability to so easily control Ga distribution like this in films prepared by chalcogenization techniques is quite remarkable and believed to be accomplished with unprecedented ease. Indeed, it is believed that providing a CIGS film including substantial Ga content in a boundary region adjacent the top surface of the CIGS film made via post chalcogenization techniques (which is evidenced by the CIGS film having a void distribution) has not been achieved.

As another significant advantage, using a chalcogen-deficient precursor as an intermediate in chalcogenization processes also yields photoelectronically active CIGS material with more favorable void characteristics. Voids generally tend to form in the film product as an artifact of subjecting the precursor to a post-chalcogenization treatment. Indeed, the presence of significant amount or size of voids is an indication that a CIGS film was produced using a post-chalcogenization process. Consequently, voids still tend to form in many modes of practice of the present invention when CIGS precursor films incorporating sub-stoichiometric chalcogen are subjected to post-chalcogenization. However, the character of the voids is much different than those formed using conventional methods. Conventionally, too much of the void content is unduly large, e.g., having a size that is at least about 25%, even at least about 50%, and even about 80% or more of the final film thickness. These large voids tend to predominate at the interface between the CIGS film and the underlying substrate, e.g., at the interface between the CIGS film and an underlying Mo layer in many instances. This large content of large interface voids clearly contributes to significantly reduced adhesion between the CIGS and the back contact layer, rendering the material difficult to process into photovoltaic modules and the like.

In contrast, the present invention tends to produce CIGS films in which the average void size is measurably less according to cross sectional electron microscopy analysis, where the cross section of the film being analyzed is polished using a polishing technique compatible with scanning electron microscopic analysis, such as either ex-situ ion-polishing or focused-ion-polishing (FIB processed). Also, rather than disrupting the backside interface, the voids are distributed primarily within the CIGS film itself in a manner that allows the CIGS film to function as a high quality photoabsorber with good adhesion to the back electrical contact layer, even when a significant number and/or size of voids remains. Per cross sectional electron microscopy analysis, CIGS material is easily detectable directly adjacent an underlying Mo layer, with voids primarily within the CIGS layer itself, instead of located near or at the interface between the CIGS layer and the underlying Mo layer.

For purposes of the present invention, the void content of a CIGS layer of a working cell is determined from scanning electron microscopy (SEM) analysis of polished cross-sections of the CIGS layer. Three random cross-sections of the active area of a cell are obtained. Because the practice of the present invention provides a very uniform void distribution, three samples are sufficient to represent the film as a whole. The three samples may be taken from any part of the active area. Preferably, the samples are non-parallel. For instance, if the active area of the cell is deemed to lie in the x-y plane, respective cross-sections can be taken along the x axis, the y-axis, and at an angle., e.g., 45° between the x and y axes. Each sample desirably is long enough such that the total length of all the samples measured desirably is at least 20 microns (for example, 10 samples each showing 2 microns of cross section; 5 samples each showing 4 microns of cross section; 3 samples each showing 7 microns of cross section; although it is not required that all samples have the same length). The thickness of each sample is not critical and may be any thickness suitable for handling and for mounting into the microscope instrument being used. One face of each sample is polished to aid microscopic analysis. Any polishing technique compatible with microscopic analysis may be used, as a variety of polishing techniques provide comparable polishing results. Focused ion beam polishing and external ion beam polishing are representative techniques. External ion beam polishing is preferred as being more widely accessible.

SEM is used to evaluate the polished surface and determine void content of the cross-section as a percentage area of the cross section occupied by voids. Because SEM analysis is being used, only the one face being evaluated needs to be polished. The void content of each individual cross-section is determined as $100\% \times A_v/A_T$, where $A_v$ is the void area of the cross-section and $A_T$ is the total area of the cross-section. Because $A_v/A_T$ is a ratio, any units for area can be used so long as the same units are used for both $A_v$ and $A_T$. The void content of the sample is the average of the three samples.

In illustrative embodiments, a CIGS photoabsorbing film made using principles of the present invention may have a void content of at least 0.5%, preferably at least 1%, more preferably at least 5%, more preferably still at least 10% and most preferably in some embodiments at least 20%. Desirably, the void content is no greater than 60%, preferably no greater than 50% of the cross-sectional area of the CIGS film when determined according to the methodology described herein. Such voids desirably have an average size in the range of at least about 0.1 microns, more preferably at least 0.2 µm and no greater than 2 microns, preferably no greater than 1.5 microns and more preferably no greater than 1.2 µm when determined according to cross-sectional scanning electron microscopy with samples prepared in cross section using the focused ion beam technique. For non-circular voids or aggregated void areas, the void size is deemed to be the length of the greatest chord that extends across the void(s). Desirably, at least more than 10%, more favorably 30%, and more favorably 50%, of the total void area includes voids that contact inner surfaces of the CIGS material only, and do not contact the CIGS-Mo interface.

As another advantage of using precursors with stoichiometrically deficient chalcogen content, volume expansion can be significantly reduced when the precursor is subjected to a chalcogenization treatment, depending on the amount and location of chalcogen in the precursor film. Reduced volume expansion is reflected in the reduction of total void content. It is noted, however, that volume expansion may not be the only mechanism that causes formation of voids. Without wishing to be bound, another cause could be attributable to the substantial segregation of metals within the precursor metal film whether deposited as separate layers or as an alloy. At the metallic ratios commonly used (e.g. at least (In+Ga)/Cu=1 or higher), indium may tend to exist as segregated islands on the surface of a CIG alloy film (when sputtering from a CIG alloy target, or CuGa+In confocal targets), or metallic Cu and In could exist if depositing the metals separately as layers. These metals react at different rates upon post-selenization in a very complex fashion. The use of a more isotropic precursor film according to the present invention may help to avoid undesirable phases during post-selenization, and/or reduce unwanted diffusion or melting of segregated metallic areas.

Chalcogenizing a stoichiometrically deficient precursor also allows the chalcogenization step to be carried out uniformly and rapidly. Chalcogenizing a conventional, chalcogen-free precursor is less uniform in several respects. In a conventional process in which a chalcogen such as Se is incorporated into the film only after a metallic precursor is formed, for instance, Se reaches some portions of the film right away. Other portions see the Se only after a period of delay. Consequently, some portions of the film are subjected to Se conditions longer than other portions as the migration occurs. The extent and/or nature of the reactions that occur will vary with the migration as a consequence. In contrast, when practicing the present invention, the chalcogen already partially exists generally throughout the precursor film or in selected areas. Selenization conditions are more uniform inasmuch as the dependence upon migration is substantially reduced. Additionally, the initial precursor film is likely not a single alloy, but could be a mixture of Cu, Ga, In, and alloys thereof. The precursor film may undergo more complex reactions during post-chalcogenization and annealing, with undesirable phases forming. If chalcogenide is only supplied as a "cap" of solid material or a gas after the precursor film is fully formed, chalcogen migration into the film could occur only directionally via a top-down process leading to stress and/or unduly large voids.

The fact that the stoichiometrically deficient precursor film yields a high quality, industrially compatible (e.g., capable of being incorporated into continuous, high speed processes with large area deposition such as continuous roll to roll processes), CIGS photoabsorbing layer upon chalcogenization is quite surprising. From a conventional perspective, sputtering from sources including chalcogen generally yields an extremely poor quality film precursor. As one serious deficiency, the initial sputtering stage generally produces overall a CIGS precursor film incorporating a sub-stoichiometric amount of chalcogenide, even when a stoichiometric CIGS target is used. The deficiency is exacerbated by the fact that chalcogen may react with other precursor constituents to form volatile species, e.g., $In_xSe_y$ species, which can be volatized and lost.

Additionally, although sputtered stoichiometric CIGS films have been used in attempts to make high quality CIGS photoabsorbers, the sub-stoichiometric CIGS compositions have not. Chalcogen vacancies in substoichiometric films create very undesirable electronic defects in CIGS thin films, typically rendering the material incapable of forming a working photovoltaic device. Efficiencies are very low and even zero in many instances. Substoichiometric CIGS compositions also may suffer from other serious deficiencies such as reduced light absorption, poor carrier mobility and lifetime (likely due to the chalcogen vacancies), and poor grain structure. These deficiencies may also be related to a non-optimized post-selenization reaction, which concurrently anneals the film. Accordingly, the industry tends to disregard and discard these sub-stoichiometric films as viable candidates for making high quality CIGS photoabsorbing compositions.

Conventional wisdom would be strongly motivated to disregard and discard the deficient product as a viable route to high quality CIGS photoabsorber layers on the industrial scale. The present invention is quite significant because the present invention overcomes this strong negative bias. The present invention is based on the discovery that, although a precursor film intentionally deficient in chalcogen does not itself form a good photoabsorber, such a film nonetheless is an exceptional intermediate and stepping stone on a path to produce high quality, photoabsorbing CIGS material. Without the "pre"-addition of chalcogen into the precursor itself, these precursor films would have been viewed as suboptimal inasmuch as they would exhibit very large void formation, too much volume expansion, subsequent poor adhesion, and/or substantially no Ga within the top portion of the film upon chalcogenization.

In many embodiments, the photoelectronically active chalcogenide materials useful in the practice of the present invention preferably incorporate at least one IB-IIIB-chalcogenide, such as selenides, sulfides, tellurides, and/or combinations of these that include at least one of copper, indium, aluminum, and/or gallium. More typically at least two or even at least three of Cu, In, Ga, and Al are present. Sulfides and/or selenides are preferred. In many embodiments, these materials are present in polycrystalline form. Some embodiments include sulfides and/or selenides of copper and indium. Additional embodiments include selenides or sulfides of copper, indium, and gallium. Specific examples include but are not limited to copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGS) materials. Such materials are referred to by acronyms such as CIS, CISS, CIGS, CIGST, CIGSAT, and/or CIGSS compositions, or the like (collectively CIGS compositions hereinafter unless otherwise expressly noted otherwise). CIGS materials also may be doped with other materials, such as Na, Li, or the like, to enhance performance. In many embodiments, CIGS materials have p-type characteristics.

Oxygen (O) is technically a chalcogen according to its placement in the periodic table of the elements. However, oxygen is deemed not to be a chalcogen for purposes of the present invention inasmuch as oxygen does not contribute to photoabsorbing functionality to the extent of the other chalcogens such as S and/or Se. Even though oxygen does not promote photoabsorbing functionality to the same degree and/or in the same manner as Se or S, oxygen may still be incorporated into CIGS materials, e.g., many chalcogen materials could incorporate at least some oxygen as an impurity that does not have significant deleterious effects upon electronic properties.

Advantageously, the chalcogen-containing, photoabsorbing materials exhibit excellent cross-sections for light absorption that allow photoelectronically active films incorporating these materials to be very thin and flexible. In illustrative embodiments, a typical absorber region may have a thickness in the range from about 0.8 μm to about 5 μm, preferably about 1 μm to about 2 μm.

One preferred class of CIGS materials may be represented by the formula

$$Cu_aIn_bGa_cAl_dSe_wS_xTe_yNa_z \qquad (A)$$

Wherein, if "a" is defined as 1, then:
"(b+c+d)/a"=1 to 2.5, preferably 1.05 to 1.65
"b" is 0 to 2, preferably 0.8 to 1.3
"c" is 0 to 0.5, preferably 0.05 to 0.35
d is 0 to 0.5, preferably 0.05 to 0.35, preferably d=0
"(w+x+y)" is 1 to 3, preferably 2 to 2.8 (note, (w+x+y)<2 for substoichiometric precursor films)
"w" is 0 or more, preferably at least 1 and more preferably at least 2 to 3
"x" is 0 to 3, preferably 0 to 0.5
"y" is 0 to 3, preferably 0 to 0.5
"z" is 0 to 0.5, preferably 0.005 to 0.02

The copper indium selenides/sulfides and copper indium gallium selenides/sulfides are preferred. Strictly stoichiometric illustrative examples of such photoelectronically active CIGS materials may be represented by the formula

$$CuIn_{(1-x)}Ga_xSe_{(2-y)}S_y \qquad (B)$$

where x is 0 to 1 and y is 0 to 2. As measured and processed, such films usually include additional In, Ga, Se, and/or S.

Corresponding precursors of such CIGS materials generally would include constituents in the same proportions as specified in Formula A or B, including additional In and/or Ga as applicable to compensate for In loss during post-chacogenization, except that the chalcogen content is sub-stoichiometric in the precursor. A stoichiometric CIGS composition generally includes at least one chalcogen atom for each metal atom included in the composition. A CIGS composition is sub-stoichiometric with respect to chalcogen when the ratio of chalcogen atoms to the sum of all metal atoms is less than 1. Thus, with regard to Formula A, w+x+y=a+b+c+d for a fully stoichiometric material. However for the substoichiometric precursor, the ratio of w+x+y to a+b+c+d is less than 1, preferably less than about 0.9, more preferably less than about 0.8, even more preferably less than about 0.6 and even more preferably less than about 0.4. On the other hand, it also is preferred that sufficient chalcogen is incorporated into the precursor to provide a desired benefit. Accordingly, the ratio of the ratio of w+x+y to a+b+c+d in the substoichiometric precursor is at least about 0.01, more preferably at least about 0.2, and more preferably at least about 0.3. These ratios can be determined by ICP-OES (inductively coupled plasma optical emission spectroscopy).

The precursor film is sub-stoichiometric with respect to chalcogen overall. However, if chalcogen(s) are selectively incorporated into one or more portions of the precursor, those portions independently may include substoichiometric, stoichiometric, or even an excess of chalcogen locally.

The ICP-OES method can be used to measure a chalcogen deficiency indicative of a precursor that is sub-stoichiometric with respect to chalcogen. Using this technique, a film is stoichiometric with respect to chalcogen when the measured atomic ratio of Se/(Cu+In+Ga) is 1.0 or higher. For sub-stoichiometric films, this ratio is less than 1.0. For example, one precursor film has a Se/(Cu+In+Ga) ratio of 0.88 as grown (Example 1 below); another has a Se/(Cu+In+Ga) ratio of 0.33 as grown (Example 2 below), with the Se distributed throughout the film; Example 3 below another has a Se/(Cu+In+Ga) ratio of 0.07, with all of the Se located in a thin layer approximately 0.1 microns deep at the back side of the precursor film. Sub-stoichiometric characteristics are distinguished from fully stoichiometric CIGS film that lose only a slight amount of Se at the top surface, such as if it is heated in a vacuum without a Se source to cause Se vacancies. Such a film may still have a Se/(Cu+In+Ga) ratio of 1.0 or higher as measured by ICP.

The precursor films may include one or multiple layers. In precursor embodiments including two or more layers, the interfaces between layers may be distinct or can be graded transitions. A graded transition is one where the interface between the layers is not sharp and easily identifiable. Precursor films with multiple layers allow the constituents of the precursor to be independently and easily allocated among one or more of the layers. This allows constituents such as chalcogen(s), Ga, or others to be selectively placed in some layers but excluded or used in lesser amounts in other layers. For example, chalcogen(s) may be incorporated (optionally co-incorporated with Ga or Al) into one or more selected regions of the precursor film in which the presence of the chalcogen(s) would be most desirable. As one option, chalcogen(s) can be incorporated into a layer of the precursor film that is proximal, preferably directly proximal, to the backside in order to promote adhesion, void reduction, and/or to help function as a minority carrier mirror. As another or additional option, chalcogen(s) can be incorporated into a layer of the precursor film that is proximal, preferably directly proximal, to the top of the precursor film to facilitate Ga incorporation (via reduced Ga migration, for example) and corresponding bandgap enhancement. Chalcogen(s) need not be incorporated into other portions of the precursor, or if present could be incorporated in lesser amounts.

For example, chalcogen-containing target(s), or a mixed sputtering and vapor or gas phase chalcogen process, could be used to deposit the selected regions designated to include chalcogen content. The rest of the film could be provided by standard Cu, In, CuGa, or CuIn, CIG alloy targets, and/or the like. Thus, in one embodiment, a CIGS precursor film includes at least a first region of the film that incorporates chalcogen, at least a second region that incorporates chalcogen, and a third region interposed between the first and second regions that includes substantially no chalcogen as deposited. This can be measured with the scanning XTEM with EDS technique across a cross-sectional sample of the film.

When chalcogen is selectively placed into regions (each of which independently may be formed of single or multiple layers but is often formed from a single layer), each such region independently may have a thickness selected from a wide range. In illustrative embodiments, each such region independently has a thickness of at least about 5 nm, preferably at least about 50 nm, more preferably at least about 100 nm, and desirably the thickness is less than about 1000 nm, more preferably less than about 500 nm, and more preferably less than about 400 nm. In one embodiment a region having a thickness of about 300 nm would be suitable. Generally, individual layers used to make the overall film would independently have thicknesses in these ranges as well. In view of the risk of Ga migration, Ga desirably is selectively co-incorporated into the precursor with chalcogen(s). Optionally, Ga need not be incorporated into other regions of the precursor or could be incorporated in lesser amounts.

A precursor film formed from a single or multiple layers can have an overall thickness over a wide range. Generally, if the overall film is too thin, the layer may not be continuous after post-processing or may yield a final film have a low cross-section for capturing incident light. Layers that are too thick are wasteful in that more material would be used than is needed for effective capture of incident light. Thicker layers also present more recombination defect opportunities for the charge carriers, which could degrade cell efficiency. Balancing these concerns, many illustrative embodiments of precursor films including at least some chalcogen have thicknesses of at least about 0.1 microns, preferably at least about 0.4 microns, and preferably the thickness is up to about 0.6 microns, preferably up to about 2.0 microns. In one mode of practice, a precursor film having a thickness of about 0.6 microns was converted to a final CIGS film having a thickness of about 2 microns. Precursor films that include larger amounts of chalcogen tend to be thicker than precursor films that contain lesser amounts of chalcogen.

Forming precursor films from multiple layers offers the opportunity to increase throughput when sputtering techniques are used to make at least a portion of the precursor. Generally, targets incorporating chalcogen(s) such as Se sputter much more slowly than targets that are chalcogen-free. To increase overall production rates, sputtering can begin according to an illustrative embodiment by sputtering from target(s) incorporating Se, S, and/or Te to form a thin chalcogen-containing layer proximal to the substrate. For reasons including reducing Ga migration, it is also desirable that a layer at the top of the precursor incorporates chalcogen(s) as well. One or more additional layers can be sputtered at faster rate(s) by using targets that are chalcogen-free. This approach provides the benefits of using sputtered chalcogen while also accessing higher deposition rates for a portion of the deposition when chalcogen is not being sputtered.

Because Ga is expensive, it would be valuable to incorporate this element, if present, only into selected region(s) where the presence of Ga yields sufficient benefit. This also can be implemented easily in multilayer precursors by incorporating Ga only into the appropriate layers. In one mode of practice, Ga would be deposited into the top region (which may be formed from one or more layers) of the precursor film that includes at least a portion, preferably at least substantially all of the film depth in which light is absorbed so that the bandgap expansion of Ga helps to augment device performance. In many illustrative embodiments, this corresponds to including Ga in the top of the film to a depth of at least about 10 nm, preferably at least about 20 nm, more preferably at least about 30 nm up to a depth of at least about 1000 nm, preferably up to about 300 nm, more preferably up to about 200 nm in the top boundary region of the precursor. It can also be helpful to include Ga in at least the bottom boundary region of the precursor film to a depth of at least about 10 nm, preferably at least about 20 nm, more preferably at least about 30 nm up to a depth of at least about 1000 nm, preferably up to about 300 nm, more preferably up to about 200 nm. In this bottom boundary region (which may be formed from single or multiple layers), the Ga may help with adhesion and/or act as a "mirror" to minority carriers. Such Ga-containing regions may be formed from single or multiple layers.

Because the benefits of using Ga tend to be most prominent with respect to Ga included in the boundary regions, Ga preferably is present in both boundary regions. Ga between these regions is optional and even can be omitted to save substantial expense in manufacturing costs. Thus, in some embodiments, at least one region may exist between the boundary regions that includes substantially no Ga. To help reduce Ga migration, the regions including Ga desirably also include at least one chalcogen. Regions that do not include chalcogen may still include Ga, if desired. This Ga may migrate during post-selenization, but the migration of Ga where the chalcogen was located will be reduced, forming the desired end profile.

The amount of Ga included in one or both of these boundary regions can vary over a wide range. Desirably, preferred modes of practice would provide sufficient Ga in the top region of the final CIGS film to a suitable depth to capture incident light such that the bandgap of the CIGS in this active area of the film is approximately 1.1 to 1.3 eV. In many representative embodiments, a CIGS precursor film is prepared wherein the film includes from about 0.1 atomic percent to about 60, preferably about 2 to about 10 atomic percent Ga in boundary regions adjacent at least one of the top and bottom surfaces of the CIGS film.

A variety of methods can be used to form the precursor films. Examples include sputtering of chalcogen-containing targets, optionally at the same time as sputtering non-chalcogen containing targets; sputtering chalcogen-free targets in the presence of chalcogen-containing gas(es) or vapor(s); using evaporation techniques to provide all constituents; chemical ink rolling techniques; combinations of these, and the like. Sputtering techniques are preferred in which one or more targets are used to deposit the precursor film onto a substrate or portion of a substrate, wherein at least one sputtering target incorporates at least in part a chalcogen selected from Se, S, and/or Te. Se and/or S are more preferred. Se is particularly preferred.

Sputtering offers many advantages. Sputtered chalcogen species (such as ionized Se) are more reactive than Se compounds (such as but not limited to $Se_2$ or $Se_6$ or $Se_8$ rings, etc.) that are formed by processes relying solely upon evaporation or other similar techniques. Via sputtering, reactive Se is very easily incorporated into the growing precursor film. While not wishing to be bound by theory, it is believed that the sputtered Se is in the form of highly reactive ion gas phase species, such as $Se^+$. If the sputter process is performed at low enough pressures and small enough distances between the target and substrate, the kinetic energy and ionization state of these precursor species is substantially preserved, further promoting incorporation into the depositing precursor film.

Generally, due to factors including the reactivity of the sputtered chalcogen, the sputtered species impinge upon the substrate and are incorporated into the growing precursor film at high efficiency. More of the chalcogen such as Se ends up in the precursor film rather than coating and contaminating the chamber, as otherwise tends to occur out of place with processes such as hybrid sputtering/evaporation. The overall amount of Se needed is reduced since less is wasted.

As another advantage, sputtering need not occur in the presence of additional evaporated or other chalcogen source(s). This is highly desirable inasmuch as Se- and S-containing gases such as $H_2Se$ and $H_2S$ are costly and require careful handling. The use of these gases reactively can poison metallic or metallic alloy sputter targets and can cause a significant loss of indium in the growing film.

Furthermore, lesser amounts of chalcogen material may be needed in the subsequent chalcogenization ("post-selenization") stage, since a portion of the desired chalcogen is already incorporated generally throughout or in selected areas of the precursor film.

Sputtering techniques also are easily applied to form precursor films that are deficient in chalcogen. Making a precursor film with a sub-stoichiometric amount of chalcogen is relatively easy in contrast to the challenge of forming a high quality stoichiometric film via sputtering or reactive sputtering alone. One reason for this difficulty, as exemplified by sputtering Se containing targets, is that a portion of the Se is lost during the sputtering process. Using targets with excess chalcogenide is not a practical option to overcome the Se loss, as such targets are difficult to make due to the unsuitability to pure Se or high-Se binary phases for sputtering. Even if sputtering uses stoichiometric targets, a precursor that is sub-stoichiometric in Se may result anyway. Another reason for this difficulty is the positioning of targets or vacuum machinery using reactive sputtering or hybrid processes when a large amount of Se is needed.

Consequently, the present invention offers the opportunity to use one or more targets in which the chalcogen content within the target(s) is sub-stoichiometric. These targets may be much easier and less costly to make. Additionally, the sputtering rate favorably tends to increase as the chalcogen content in the target is lower. Consequently, using targets with sub-stoichiometric chalcogen content offers the opportunity for faster throughput (such as $Cu_2Se$).

One or more targets can be used to form the precursor CIGS film so long as at least one target includes at least one chalcogen and the target(s) containing chalcogen(s) are used to form the precursor CIGS film for at least a portion of the total sputtering time. If more than one target is used, these can be used simultaneously, in overlapping fashion, and/or in sequence. Different sputtering parameters can be used with different targets to optimize deposition characteristics. In preferred embodiments, the chalcogen containing targets may include sub-stoichiometric amounts, stoichiometric amounts, or even an excess of one or more chalcogens. One exemplary chalcogen containing target includes copper and selenium, such as a $Cu_2Se$ target. Another exemplary chalcogen containing target includes Cu, In, Ga, and Se. Chalcogen containing targets may be used singly or in combination with one or more other targets, such as metallic targets containing Cu, In, CuGa, CuIn, CIG, or the like.

One factor impacting target selection concerns whether the precursor film will be formed from single or multiple layers. A single layer precursor film that incorporates Cu, In, Ga, and Se, for example, can be formed in one embodiment by sputtering a target containing all these ingredients onto the desired substrate. Multiple targets also may be used to form a single layer precursor film. As one example, a single layer precursor film that incorporates Cu, In, Ga, and Se can be formed according to an illustrative embodiment by confocal sputtering from a first target containing Cu, In, Ga, and Se, and a second target comprising Cu, In, and Ga. Desirably, the second target is In-rich with respect to the stoichiometric amount of In to help ensure that enough In is incorporated into the precursor film.

Exemplary embodiments of targets suitable in the practice of the present invention are described further below in connection with FIGS. 1 through 3. Suitable targets containing at least one chalcogen and at least one of Ga, In, Cu, Na, Al, Li, O, combinations of these, and the like can be sourced commercially.

In selecting sputtering parameters, one consideration is to avoid undue collisions of the desired species from the point of creation to the arrival at the growing film at the substrate. Those knowledgeable in the art consider this to mean that the "mean free path" of the sputtered species desirable is greater than the target-to-substrate distance. To practice such principles, exemplary modes of practice are characterized by a target to substrate distance in the range from at least about 1 cm, preferably at least about 3 cm up to about 30 cm, more preferably up to about 15 cm, with sputter pressures of at least about 0.5 mTorr, preferably at least about 3 mTorr up to about 50 mTorr, more preferably up to about 3 to 5 mTorr. In one embodiment, a target-to-substrate distance of about 8 to 10 cm coupled with a sputter pressure of 3 to 5 mTorr would be suitable.

Sputtering can be carried out at a wide range of substrate temperatures. As used in this context, the sputtering temperature refers to the surface temperature of the substrate onto which the precursor film is being grown. For example, sputtering may occur at room temperature with no intentional substrate heating. On the other hand, the temperature should not be so high so as to unduly degrade constituents of the substrate or the growing precursor film. As general guidelines, using temperatures in the range from about −25° C. to about 650° C., preferably about 5° C. to about 600° C., more preferably about 20° C. to about 550° C., would be suitable in many embodiments. In exemplary embodiments, sputtering temperatures initiated at about room temperature without intentional heating other than that provided by the heat of reaction ("room temperature"), 240° C., 400° C., and 550° C. all provided precursor films that were converted into high quality CIGS photoabsorbing compositions. Substrate measurements indicate that the substrate temperature initiated at about room temperature without intentional heating reached about 60° C. during growth. At this temperature, the resultant chalcogen-containing precursor films appear to be amorphous and featureless by SEM, with a very slight, small grain size (<100 nm) of CIGS material detected by XRD.

Sputtering temperature impacts the phase characteristics of the precursor film. Without wishing to be bound, it is believed that some precursor films may incorporate substantial amorphous content. XRD analysis of precursors shows that crystalline content appears to become greater at higher sputtering temperatures. For example, a single layer CIGS precursor film incorporating Cu, In, Ga, and Se was sputtered at room temperature. During the course of sputtering, the substrate temperature increased without additional heating to 60° C. SEM analysis suggests this precursor film has a predominantly featureless structure with substantially no observable crystalline facets or grains, but small crystal grains on the order of about 11.6 nm in size are detected by XRD. The precursor film had an (In+Ga)/Cu ratio of 1.05 and a Se/Cu ratio of 2.04. Another embodiment of a precursor film that was sputtered at 400° C. using the same kind of target included slightly larger crystalline grains on the order of about 35.2 nm in size by XRD. This embodiment showed an (In+Ga)/Cu ratio of 1.08 and Se/Cu ratio of 1.82. An additional embodiment of a precursor film that was sputtered at 550° C. using the same kind of target and according to SEM and XRD analysis had a full, high quality crystal structure with crystalline grain size greater than 100 nm.

Consequently, sputtering temperature can impact the steps that might be used subsequently to convert the precursor to the final form. Temperature may also impact the parameters used to carry out those steps. For example, the precursor film tends to be more amorphous with smaller crystalline domains at lower sputtering temperatures. Consequently, the precursor desirably is chalcogenized and crystallized in order to obtain the desired tetragonal, chalcopyrite phase. If the precursor film is formed above about 500° C., the precursor film may already be converted to the desired separate crystalline structure and a crystallizing step may not be required. In this case, chalcogenization may be all that is required to complete the CIGS layer, and chalcogenization may occur at lower temperatures, in less time, and/or under different conditions. Even in such embodiments in which sputtering occurs above about 500° C., annealing may still be desirable to further improve crystalline characteristics if desired.

Analysis of a sample where the substrate was maintained at about 400° C. during sputtering also shows how Ga migration advantageously is reduced after chalcogenization when practicing the present invention. Analysis of the precursor film showed that the sample had a very even Ga profile through film depth as deposited, and that this profile remained even after being converted to a CIGS photoabsorber. The resultant CIGS photoabsorbing layer also was characterized by very smooth interfaces, reduced void content, and voids reduced in size. The layers were favorably quite dense. In contrast, a conventional process (in which a precursor film is formed from sputtered films in the absence of sputtered chalcogen that are later selenized) yields CIGS layers with extremely rough surfaces, poor adhesion, flaky composition, many huge voids (on the order of 50% to 100% of the film thickness itself), and a near total Ga deficiency near the top surface due to severe Ga migration. The selenized sample films also showed excellent adhesion characteristics. A sample obtained by selenizing a precursor sputtered at 400° C., for instance, was bent through 180 degrees at 1 cm radius without cracking at room temperature.

Sputtering may occur at a variety of pressures such as normally are used for sputter deposition of metals. Generally, if the pressure is too low, it may be difficult to light or sustain a plasma. If too high, the sputtered species may lose too much kinetic energy. This does not preclude the use of high pressures for sputtering, but the results may be non-optimal. High pressures also can be difficult to implement with vacuum equipment when it is desirable to obtain low background pressures of water vapor, nitrogen, and other contaminants. Desirably, the pressure is selected so that, when coupled with the target-to-substrate distance used, interactions among the sputtered species are minimized as much as is practical, and so that kinetic energy of the species is preserved in large part. One exemplary pressure would be in a range from about 1 mTorr to about 50 mTorr. More preferably, the pressure would be within a standard magnetron sputter range of about 3 mTorr to about 20 mTorr. In some instances, such as when using confocal targets, shielding and gas injection can be used to minimize the risk that sputtered species could contaminate other target(s).

The film precursor is subjected to one or more chalcogenization treatments. Chalcogenization generally refers to exposing the film precursor to at least one chalcogen source under conditions to cause the chalcogen content of the film to increase. For instance, if the film precursor includes a sub-stoichiometric amount of chalcogen(s), chalcogenization can be carried out so that the chalcogen content is increased to be substantially at the stoichiometric amount, or even in excess relative to the stoichiometric amount. Chalcogenization generally helps convert the CIGS precursor film into a photoactive chalcopyrite film with substantially isotropic phase formation throughout the film.

The one or more chalcogen sources used for chalcogenization may include one or more gases, solids, liquids, gels, combinations of these, and the like. Exemplary gas phase sources of chalcogen include $H_2S$, $H_2Se$, combinations of these, and the like. In some illustrative embodiments, the gas source is generated as vapor via evaporation from solid or liquid material and is present in an overpressure in order to facilitate mass transfer of chalcogen into the film. Exemplary solid phase chalcogen sources include S or Se, combinations of these, and the like. In some illustrative embodiments, a solid cap of one or more chalcogen-containing species is provided in intimate contact with the surface of the precursor film to carry out chalcogenization. In other illustrative embodiments, chalcogenization may be carried out by exposing the precursor film to both gas phase chalcogen source(s) as well as one or more solid caps.

Chalcogenization often occurs at temperature(s) that are sufficiently high to achieve the desired chalcogenization in a reasonable time period without undue risk of degrading components of the workpiece(s) being treated. In exemplary embodiments involving selenization and/or sulfurization, a chalcogenization treatment may occur at one or more temperatures in the range from about 300° C. to about 650° C., preferably about 500 to about 575 for a time period of about 10 seconds to about 2 hours, preferably 10 mins to about 20 mins. Additional time may be used to ramp temperature up and down according to a desired ramp profile. Ranges of ramp speeds commonly used include 30 C/min to 350 C/min or higher. The chalcogen source may be applied and removed at any time(s) during such ramps as desired. The chalcogen supply may be maintained as the sample cools down to approximately 200° C. to about 400° C. to help avoid loss of chalcogen from the near surface of the film.

An optional crystallization step may be carried out in order to convert the precursor film to the final desired crystal form in the event the film is not yet in such form. For instance, if sputtering occurs at a temperature below about 500° C., crystallization may be required to convert the precursor film into a desired chalcopyrite structure with grains leading to high electronic quality. On the other hand, above about 500° C., the precursor film may already be in the desired crystalline form and an anneal itself may not be needed. Even in such instances, may be desirable to anneal in any event to improve crystalline characteristics. Chalcogenization is performed even if annealing is not needed or desirable.

The optional crystallization step can be carried out using any desired methodology. Annealing the film precursor at suitable temperature(s) for a suitable time period at a suitable pressure is one convenient way to accomplish annealing. Because chalcogenide is already distributed throughout at least a portion of the film, the temperature and/or time to achieve desired crystallization may be less than if the precursor is chalcogen-free and is formed using conventional techniques. As general guidelines, annealing may occur at a temperature in the range from about 400 C to about 650 C for a time period in the range from about 10 mins to about 60 mins. Desirably, annealing may occur in a suitable protected, non-oxidizing, dry environment such as a vacuum. The optional annealing step may occur prior to subsequent chalcogenization. Alternatively, annealing may occur at least in part or wholly at the same time that chalcogenization is carried out.

One exemplary method 10 for incorporating CIGS material into a photovoltaic device using principles of present invention is schematically shown in FIG. 1. Method 10 is representative of embodiments in which a single target 21 is used to form a single layer precursor film 23. In step 12, a representative substrate 20 is provided onto which precursor CIGS film 23 will be grown in step 14. Substrate 20 generally refers to the body on which the CIGS precursor film 23 is formed and often incorporates multiple layers. In the illustrative embodiment, substrate 20 generally includes support 22 and backside electrical contact region 24. Support 22 may be rigid or flexible, but desirably is flexible in those embodiments in which the resultant photovoltaic device 25 may be used in combination with non-flat surfaces. The backside electrical contact region 24 provides a convenient way to electrically couple the resultant device 25 to external circuitry.

In step 14, a single target 21 is used to sputter CIGS precursor film 23 onto the substrate 20. The target 21 as shown generally includes Cu, In, Ga, and Se according to the proportions $CuIn_{(1-x)}Ga_xSe_y$, wherein x is in the range from 0 to 1 and y is in the range from about 0.01 to about 2, preferably about 0.1 to about 1.95, more preferably about 0.2 to about 1.85. These targets may also include Na, O, S, Al, or Li if desired.

In step 16, the precursor film 23 is annealed to increase the crystalline content of the film 23, preferably so that at least substantially the entire film 23 has the desired crystalline structure, grain size, or intermediary step. Next in step 18, the precursor film 23 is subjected to a chalcogenization treatment in order to convert film 23 into a CIGS photoabsorber layer hereinafter also referred to as absorber region 23. Steps 16 and 18 may occur at the same time. One method of chalcogenization would further include the evaporation of a Se cap on top of region 23 prior to the application of step 16, or between step 16 and step 18.

In step 19, additional layers are added to complete photovoltaic device 25 in accordance with conventional practices now or hereafter developed. Each of these additional regions is shown as a single integral layer, but each independently can be a single integral layer as illustrated or can be formed from one or more layers.

A heterojunction may be formed between the absorber region 23 and the transparent conductive layer 30. The heterojunction is buffered by buffer region 28. Buffer region 28 generally comprises an n-type semiconductor material with a suitable band gap to help form a p-n junction proximal to the interface 32 between the absorber region 23 and the buffer region 28. An optional window region 26 also may be present. Optional window region 26 can help to protect against shunts. Window region 26 also may protect buffer region 28 during subsequent deposition of the transparent conductive layer 30. Each of these regions is shown as a single integral layer, but can be a single integral layer as illustrated or can be formed from one or more layers.

One or more electrical conductors are incorporated into the device 25 for the collection of current generated by the absorber region 23. A wide range of electrical conductors may be used. Generally, electrical conductors are included on both the backside and light incident side of the absorber region 23 in order to complete the desired electric circuit. On the backside, for example, backside electrical contact region 24 provides a backside electrical contact in representative embodiments. On the light incident side of absorber region 23 in representative embodiments, device 25 incorporates a transparent conductive layer 30 and collection grid 36. Optionally an electrically conductive ribbon (not shown) may also be used to electrically couple collection grid 36 to external electrical connections.

A protective barrier system 40 is provided. The protective barrier system 40 is positioned over the electronic grid 36 and helps to isolate and protect the device 10 from the environment, including protection against water degradation. The barrier system 40 optionally also may incorporate elastomeric features that help to reduce the risk of damage to device 10 due to delamination stresses, such as might be caused by thermal cycling and or localized stress such as might be caused by impact from hail and or localized point load from the weight of an installer or dropped tools during installation.

Additional details and fabrication strategies for making layers and features 22, 23, 24, 26, 28, 30, 36, and 40 are described in U.S. Provisional Patent Application Ser. No. 61/258,416, filed Nov. 5, 2009, by Bryden et al., entitled MANUFACTURE OF N-TYPE CHALCOGENIDE COMPOSITIONS AND THEIR USES IN PHOTOVOLTAIC DEVICES; U.S. Provisional Patent Application Ser. No. 61/294,878, filed Jan. 14, 2010, by Elowe et al., entitled MOISTURE RESISTANT PHOTOVOLTAIC DEVICES WITH EXPOSED CONDUCTIVE GRID; U.S. Provisional Patent Application Ser. No. 61/292,646, filed Jan. 6, 2010, by Popa et al., entitled MOISTURE RESISTANT PHOTOVOLTAIC DEVICES WITH ELASTOMERIC, POLYSILOXANE PROTECTION LAYER; U.S. Provisional Patent Application Ser. No. 61/302,667, filed Feb. 9, 2010, by Feist et al., entitled PHOTOVOLTAIC DEVICE WITH TRANSPARENT, CONDUCTIVE BARRIER LAYER; and U.S. Provisional Patent Application Ser. No. 61/302,687, filed Feb. 9, 2010, by DeGroot et al., entitled MOISTURE RESISTANT PHOTOVOLTAIC DEVICES WITH IMPROVED ADHESION OF BARRIER FILM, each of which is independently incorporated herein by reference for all purposes in its respective entirety.

Figure 2:
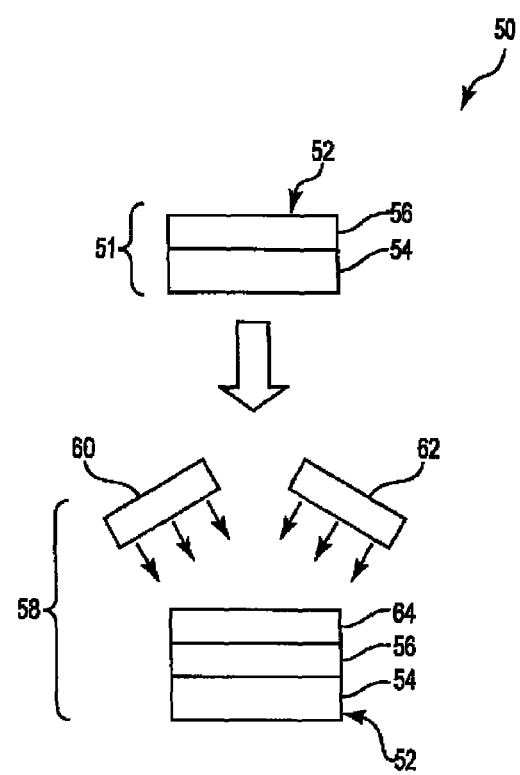
FIG. 2 is a schematic diagram showing how to make an alternative embodiment of a CIGS photoabsorbing layer, wherein multiple confocal targets are used to prepare a single layer CIGS precursor film.

FIG. 2 schematically illustrates an alternative embodiment of a method 50 in which multiple targets are used to sputter a single layer precursor film 64 onto a substrate 52. In step 51, a substrate 52 is provided. As in FIG. 1, an illustrative substrate construction is shown including support 54 and backside electrical contact 56. In Step 58, confocal targets 60 and 62 are used to sputter CIGS film precursor layer 64 onto substrate 52. Target 60 has the composition $Cu_xSe_y$, wherein x is approximately 2 and y is approximately 1. Other chalcogen-containing targets could be used in place of target 60 and/or in combination with target 60. For example, an alternative chalcogen-containing target could be the Cu, In, Ga, and Se target described in FIG. 1. As another alternative, some or all of the Se in target 60 could be substituted with S and/or Te. Target 62 generally is chalcogen-free and incorporates Cu, In, and Ga according to the formula $CuIn_pGa_{(1-p)}$, wherein p desirably is in the range from about 0.5 to about 1. After the precursor film 64 is formed, additional steps (not shown) can be performed similar to those in FIG. 1 to accomplish annealing, chalcogenization, and completion of the resultant photovoltaic device. Other Cu, In, or Ga-containing targets could be used in place of target 62 and/or in combination with target 62.

Figure 3:
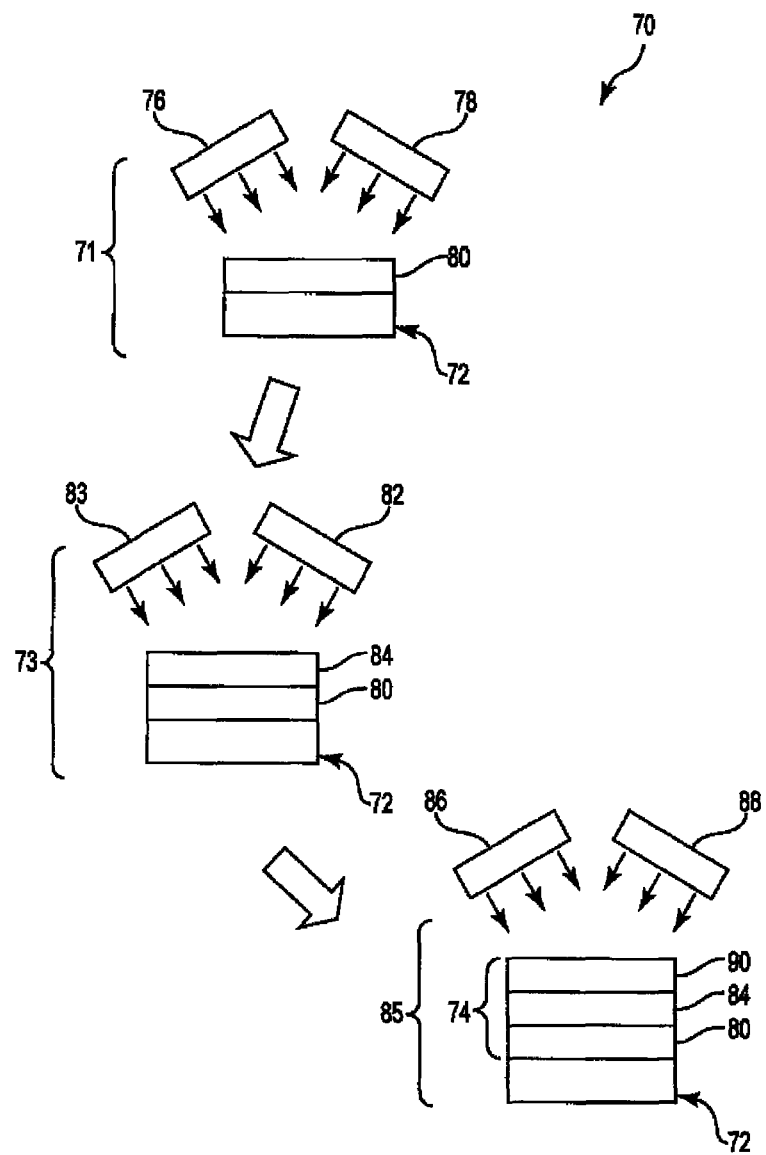
FIG. 3 is a schematic diagram showing how to make an alternative embodiment of a CIGS photoabsorbing layer, wherein multiple confocal targets are used in a sequence of steps to prepare a multilayer layer CIGS precursor film.

FIG. 3 schematically illustrates another embodiment of a method 70 in which multiple targets are used to sputter a multilayer precursor film 74 onto a substrate 72. In step 71, confocal targets 76 and 78 are used to sputter a first precursor layer 80 onto substrate 72. For purposes of illustration, target 76 incorporates chalcogen, while target 78 is chalcogen-free. Specifically, target 76 incorporates Cu and Se in the same proportions as are used in FIG. 2. Other chalcogen-containing targets could be used in place of target 76 and/or in combination with target 76. For example, an alternative chalcogen-containing target could be the Cu, In, Ga, and Se target described in FIG. 1. As another alternative, some or all of the Se in target 76 could be substituted with S and/or Te. Target 78 generally is chalcogen-free and incorporates Cu, In, and Ga according to the formula $CuIn_pGa_{(1-p)}$, wherein p desirably is in the range from about 0.5 to about 1. Other Cu, In, or Ga-containing targets could be used in place of target 78 and/or in combination with target 78.

In step 73, confocal targets 82 and 83 are used to sputter a chalcogen-free layer 84 over layer 80. In a representative embodiment, target 83 contains Cu. Target 82 contains In. Sputtering can occur at a faster rate in step 73, because both targets 82 and 83 are chalcogen-free. Alternatively, both confocal targets 82 and 83 can contain Cu and In, or Cu, In, and Ga, at different ratios, such that p according to the formula $CuIn_pGa_{(1-p)}$, is in the range from about 0.5 to about 1, and the ratio of (In+Ga)/Cu is between 1.2 and 1.8.

In step 85, confocal targets 86 and 88 are used to deposit chalcogen-containing layer 90 to complete precursor film 74. Target 86 can be a chalcogen-containing target such as any of the Se-containing targets described above with respect to this FIG. 3 or FIGS. 1 and 2. Target 88 is a chalcogen-free target containing Cu, In, and Ga as discussed above. After the precursor film 74 is formed, additional steps (not shown) can be performed similar to those in FIG. 1 to accomplish annealing, chalcogenization, and completion of the resultant photovoltaic device.

The present invention will now be further described with reference to the following illustrative examples.

COMPARATIVE EXAMPLE A

Chalcogenization of Sputtered Precursor Wherein No Chalcogen is Included in the Precursor Comparative CIGS film A is prepared by post-selenizing a precursor film deposited using a CIG alloy target, where the atomic ratio of [In+Ga]/Cu=1.2. No Se or other chalcogen is incorporated into the precursor film. Film A is deposited onto a 5×5" piece of stainless steel coated with Nb (150 nm) and Mo (350 nm) prior to the precursor deposition. A 100 diameter CIG target is sputtered at 120 W for 32 minutes with an Ar pressure of 5 mTorr to deposit a Se-free precursor film. Post-selenization is completed by evaporating a Se cap onto the precursor film, at room temperature, of 25 times the moles of Cu in the precursor film. The Se-capped precursor film is heated at approximately 30° C./min up to 550° C., holding at that temperature for 20 minutes, and allowing the sample to cool. The final film is approximately two microns thick.

Comparative Sample A shows large voids primarily at the Mo-CIGS interface. Some small voids, approximately 0.1 microns to 0.5 microns wide, are located within the CIGS film itself. These "internal" voids make up less than approximately 10% of the total void area as measured by polished SEM cross section. The "large interface" voids in this material are approximately 0.2 to 2.0 microns long in the direction parallel to the substrate plane, and between approximately 0.2 to 1.0 microns in the direction perpendicular to the substrate plane. The large interface voids are located primarily at the Mo-CIGS interface, making up approximately 90% of the total void volume. These micron-sized voids at the Mo-CIGS interface contribute to very poor adhesion of the CIGS to the underlying substrate. If a cross-sectional area is defined by the Mo surface at the bottom and CIGS surface at the top, following the measurement technique described herein where multiple, polished cross-section samples have a cumulative length of at least 20 microns are evaluated, the void content is approximately 15% of the film area computed as an average of the samples.

The Ga profile of Comparative A is measured by scanning XTEM with EDS linescan. The Ga is observed to completely segregate toward the back of the film such that there is 0.0 atomic percent Ga detected in the top 0.5 microns of the CIGS film. The level of Ga at the back side of the film reached 20.4 atomic percent.

A working photovoltaic device was made with this baseline material. The Voc (open circuit voltage) for a cell with 7% efficiency was 365 mV. Quantum efficiency measurements of this device yield a bandgap estimate of 0.98, confirming the complete lack of any Ga benefit in the photoabsorbing area of the CIGS film.

EXAMPLE 1

Preparation of CIGS Film Embodiment of the Present Invention

A CIGS film precursor is produced with a relatively high but substoichiometric level of Se throughout the precursor film. A "CIGS" sputter target (commercially available) containing the atomic ratios of In+Ga/Cu of 1.2, Ga/In of 0.3, and Se/(Cu+In+Ga)=2, 2" in diameter, is used to sputter the precursor film. The method used is pulsed DC (direct current) sputtering, with a pulse frequency of 330 kHz and an off time of 1.2 μs. The substrate is located 8 cm away from the target. The substrate is a piece of soda-lime glass coated with a 800 nm thick layer of Mo. The substrate was not intentionally heated during sputtering, but the substrate temperature during growth is estimated to be approximately 60° C. throughout the growth of the precursor film. The base pressure of the system is under $5*10^{-7}$ Torr; the sputtering pressure is 3.5 mTorr using ultra high purity Argon gas. The target is sputtered at a power of 100 W for 2.5 hours. The precursor, before selenization, has a Se/Cu atomic ratio of approximately 1.89, and a Se/(In+Ga+Cu) atomic ratio of 0.92. The precursor has a uniform Ga distribution throughout the precursor film.

Post-selenization is completed by evaporating a Se cap onto the precursor film at room temperature. The cap includes 25 times the moles of Cu in the precursor film. The Se-capped precursor film is heated at approximately 30 C/min up to 550° C., holding at that temperature for 20 minutes, and allowing the sample to cool.

The post-selenized film composition of Ga at the near surface and throughout the film is measured by scanning XTEM with EDS. The Ga composition is 7 atomic percent throughout the film, without variation (to within the measurement capability of scanning XTEM with EDS, approximately +/−0.1 atomic percent.) The adhesion of the film is excellent upon cutting and handling. The voids in the post-selenized film are very different than for the Comparative Sample A. The voids of the present Example are much smaller on average, with a size range of a few nm to approximately 0.1 microns. The voids are much more evenly distributed throughout the film, including at the Mo-CIGS interface, and throughout the CIGS film. The total void content is similar, at approximately 13%. The percentage of these voids located at the Mo-CIGS interface is estimated to be approximately 15%.

EXAMPLE 2

Preparation of CIGS Film Embodiment of the Present Invention

A CIGS film precursor is prepared with a relatively low, substoichiometric level of Se throughout the film. This film precursor is deposited with both a CIGS alloy target (Cu, In, Ga, and Se included in the target) similar to the one used in Example 1 except that the diameter is 100 mm, and a CIG alloy target (Cu and In and Ga included in the target) similar to the one used for comparative example A. The two targets are sputtered at the same time in a confocal arrangement, both at 100 W for 30 minutes at room temperature. As the CIGS target sputters much more slowly than the CIG target, this results in a bulk film with a relatively low concentration of Se throughout. In this case, the targets were 100 mm in diameter, and the substrate is a 5×5" piece of stainless steel coated with Nb (150 nm) and Mo (350 nm) prior to the precursor deposition. The Ar pressure during sputtering was 5 mTorr. All other conditions are similar to those in Example 1. The bulk composition of the precursor before post-selenization is measured via ICP. The total Se/Cu atomic ratio is 0.7, and the Se/(In+Ga+Cu) atomic ratio is 0.33. The precursor is then subjected to a similar post-selenization treatment as described in Example 1.

The film yields a working photovoltaic device. The final photovoltaic cell, including the post-selenized CIGS film, is analyzed by scanning XTEM with EDS. A reduction in the number of "Mo-CIGS interface" voids is seen. There exists a region between the Mo-CIGS interface and the bulk CIGS film that includes several very small voids as seen by scanning XTEM with EDS. This may indicate that a non-optimal post-selenization process occurs for this film, and further improvement is likely. The void size is approximately 0.2 microns across for the largest voids seen. Total void volume is approximately 9%. Approximately 50% of the voids are at the Mo-CIGS interface, and the remainder within the bottom micron of the CIGS bulk film. Scanning XTEM with EDS shows significant, but not total segregation of Ga toward the back-side of the film such that Ga is detected in the top 0.5 microns of the CIGS film at a level of between 0.3 atomic percent to 0.9 atomic percent.

A photovoltaic device made using with this film with 7% efficiency had a Voc of 350 mV, and showed a bandgap of approximately 1.02 eV as measured by quantum efficiency, which is slightly improved over that of comparative example A.

EXAMPLE 3

Preparation of CIGS Film Embodiment of the Present Invention

A precursor film is prepared that has a multilayer format to demonstrate the back-side layer benefit of an Se-containing precursor. The precursor is deposited by first using a CIGS target, (the same CIGS target used for example 2), to deposit a layer for 28% of the total deposition time, with the reminder of the film deposited from a metallic CIG alloy target, (the same CIG target used for example 2). The total time of deposition is 46 minutes, and the power on both targets is 100 W. These depositions are performed at room temperature, using a gas pressure of 5 mTorr. The two sputter sources are arranged in a confocal geometry, and similar pulsed DC sputtering conditions and target-to-substrate conditions are used as Examples 1 and 2. The substrate is also similar to the substrate of example 2, being a 5×5" piece of stainless steel, coated with Nb (150 nm) and Mo (350 nm) prior to the precursor deposition. The precursor of the present example is then subjected to a similar post-selenization treatment as described for Examples 1 and 2.

The bulk composition of the precursor film of this example before post-selenization is measured via ICP. The total Se/Cu atomic ratio is 0.28, and the Se/(In+Ga+Cu) atomic ratio is 0.11. The film yielded a working photovoltaic device. The final photovoltaic cell, including the post-selenized CIGS film, is evaluated by scanning XTEM with EDS. A dramatic reduction in the number of "large Mo-CIGS interface" voids is seen as compared to the Comparative Sample A. A thin layer of CIGS also exists, visible by XSEM and XTEM, attached directly to the Mo film at over 90% of the measured interface length. The voids remained "long" in the direction parallel to the substrate plane (approximately two microns), but were shorter in the dimension perpendicular to the substrate (approximately 0.8 microns to less than 0.1 microns). The adhesion of the film is observed by cutting and handling to be dramatically improved over the Comparative Sample A. Scanning XTEM with EDS shows total segregation of Ga toward the back-side of the film, with a level of Ga in the top 0.5 microns of the film of 0.0%. However, in the back 0.3 microns of precursor, where the CIGS (and hence Se) is originally deposited, there is a clear enhancement of the Ga concentration to approximately 16-20 atomic percent. A sudden increase of Ga content begins at the interface between the original interface of CIG- and CIGS-precursor material and continues throughout the portion corresponding to the CIGS precursor material. A working photovoltaic device is made with this material, and the Voc for a cell with approximately 7% efficiency is 329 mV and does not demonstrate a bandgap improvement via quantum efficiency measurements.

EXAMPLE 4

Preparation of CIGS Film Embodiment of the Present Invention

A precursor film is deposited using a metallic CIG alloy target, similar to the one used for examples 2 and 3, with a small concentration of $H_2Se$ gas as the Se source added to the Ar sputter gas. All other sputter and post-selenization conditions are similar to those described in Example #2. The concentration of $H_2Se$ gas is approximately 5% of the Ar as measured by flow ratio through appropriately calibrated mass flow controllers. The film is deposited for 35 minutes at room temperature. Measurements were performed using similar techniques as the other examples. The bulk composition of the precursor before post-selenization is measured via ICP. The total Se/Cu atomic ratio is 1, and the Se/(In+Ga+Cu) atomic ratio is 0.48.

Upon post-selenization, this film demonstrates an altered void structure containing a network of smaller voids both at the Mo-CIGS interface and within the CIGS itself as measured with scanning XTEM with EDS. Approximately 50% of the voids were contained within the CIGS itself, and approximately 50% at the CIGS-Mo interface. Void size is smaller than those observed in the Comparative Sample A. The average void size is 0.25 microns parallel to the substrate direction, and 0.1 microns perpendicular to the substrate direction. The adhesion of this film was comparable to that of the Comparative Sample A. The Ga distribution in the final film is significantly improved toward the front side of the film. The Ga distribution is measured by scanning XTEM with EDS to be approximately 5.0 atomic percent within the top 0.5 microns of the film. The Ga distribution steadily rises toward the back of the film to a level of approximately 12 atomic percent.

This film is made into a photovoltaic device that demonstrates improved quantum efficiency and Voc (open circuit voltage) characteristics over the Comparative Sample A. The quantum efficiency demonstrated a significant shift towards lower wavelengths, indicating a bandgap of approximately 1.12. This is improved over that of the Comparative Sample A that had quantum efficiency measurements indicating a bandgap of 0.98 eV. The Voc for a cell with 8% efficiency is 503 mV compared to 365 mV for the Comparative Sample A. Both of these improvements support the existence of a significant amount of Ga within the photoabsorbing region of the CIGS film.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of making a chalcogen-containing photoabsorbing composition, comprising the steps of:
    (a) sputtering metals comprising Cu and Ga using at least one sputtering target in the presence of a chalcogen-containing gas or vapor comprising one or more chalcogens comprising Se to form a Se-containing precursor of the chalcogen-containing photoabsorber comprising co-deposited Se and Ga selectively incorporated into one or more portions of the precursor, and wherein the Se-containing precursor includes a sub-stoichiometric amount of the one or more chalcogens comprising Se in a top region and a bottom region of the precursor and a bottom region of the precursor, and wherein said sputtering comprises selectively co-depositing Se and Ga to form the bottom region of the precursor that comprises Ga and a sub-stoichiometric amount of Se and selectively co-depositing Se and Ga to form the top region of the precursor that comprises Ga and a sub-stoichiometric amount of Se, and wherein at least one region of the precursor between the top and bottom regions includes a reduced Ga content relative to the top and bottom regions; and
    (b) subjecting the Se-containing precursor to a thermal treatment in the presence of one or more chalcogens comprising Se or Se and S to convert the precursor into a chalcogenide photoabsorbing material comprising top and bottom regions, where Ga is present in both the top and bottom regions.

2. The method of claim 1, wherein step (b) comprises causing the precursor to contact a source of chalcogen under conditions effective to increase the chalcogen content of the precursor.

3. The method of claim 1, wherein the precursor is at least partially amorphous.

4. The method of claim 1, wherein step (a) comprises sputtering at least one chalcogen-containing target to form at least a portion of the precursor in the presence of a chalcogen containing gas or vapor.

5. The method of claim 1, wherein the precursor comprises at least two metals selected from Cu, In, and Ga, and the atomic ratio of chalcogen to the cumulative amount of metals in the precursor is in the range from about 0.01 to 0.8.

6. The method of claim 1, wherein the precursor comprises at least two metals selected from Cu, In, and Ga, and the atomic ratio of chalcogen to the cumulative amount of metals in the precursor is in the range from about 0.01 to 0.8.

* * * * *